United States Patent [19]

Banks et al.

[11] Patent Number: 4,632,891
[45] Date of Patent: Dec. 30, 1986

[54] PROCESS FOR THE PRODUCTION OF IMAGES

[75] Inventors: Christopher P. Banks, Saffron Walden; Edward Irving, Burwell, both of England

[73] Assignee: Ciba-Geigy Corporation, Ardsley, N.Y.

[21] Appl. No.: 779,914

[22] Filed: Sep. 25, 1985

[30] Foreign Application Priority Data

Oct. 4, 1984 [GB] United Kingdom ............... 8425124
Dec. 19, 1984 [GB] United Kingdom ............... 8432106

[51] Int. Cl.$^4$ .................. G03C 5/00; G03C 1/52; G03C 1/495; G03C 1/71
[52] U.S. Cl. ..................................... 430/18; 430/270; 430/281; 430/280; 430/327; 430/325; 430/326; 430/195
[58] Field of Search ................ 430/327, 52, 270, 281, 430/280, 325, 326, 195, 18

[56] References Cited

U.S. PATENT DOCUMENTS

| | | | |
|---|---|---|---|
| 3,738,835 | 6/1973 | Bakos | 96/36 |
| 3,849,137 | 11/1974 | Barzynski et al. | 96/67 |
| 3,991,033 | 11/1976 | Sam | 260/67 FP |
| 4,086,210 | 4/1978 | Petropoulos | 96/35.1 |
| 4,105,518 | 8/1978 | McGinniss | 430/286 X |
| 4,252,734 | 2/1981 | Barry et al. | 522/170 |
| 4,291,118 | 9/1981 | Boduch et al. | 430/327 X |
| 4,306,010 | 12/1981 | Uehara et al. | 430/190 |
| 4,368,253 | 1/1983 | Green et al. | 430/326 |
| 4,414,311 | 11/1983 | Walls et al. | 430/278 X |
| 4,416,752 | 11/1983 | Crivello | 204/180 R |
| 4,500,629 | 2/1985 | Irving et al. | 430/195 X |
| 4,572,890 | 2/1986 | Goodin et al. | 430/325 |

FOREIGN PATENT DOCUMENTS

| | | |
|---|---|---|
| 1227602 | 4/1971 | United Kingdom . |
| 1329888 | 9/1973 | United Kingdom . |
| 1330932 | 9/1973 | United Kingdom . |
| 1489402 | 10/1977 | United Kingdom . |

*Primary Examiner*—John E. Kittle
*Assistant Examiner*—Cynthia Hamilton
*Attorney, Agent, or Firm*—Luther A. R. Hall

[57] ABSTRACT

A process for the production of an image on a substrate comprises (i) inserting the substrate as an electrode into a liquid composition comprising
  (A) a cationically polymerizable material,
  (B) a polymerizing agent for (A) which is activated by an electric current, and
  (C) a photosensitive material,
(ii) passing an electric current through the liquid composition between the substrate and another electrode, such that a photosensitive layer of essentially solid, polymerized material is deposited on the surface of the substrate,
(iii) removing the substrate from the liquid composition,
(iv) exposing the photosensitive layer to actinic radiation in a predetermined pattern so as to effect a difference in solubility between exposed parts and unexposed parts of the layer, and
(v) removing more soluble parts of the layer by treatment with a solvent, leaving less soluble parts of the layer on the substrate.

Typically, (A) is an epoxide resin, (B) is potassium hexafluorophosphate and (C) is a photocurable acrylate or a quinone diazide.

20 Claims, No Drawings

PROCESS FOR THE PRODUCTION OF IMAGES

This invention relates to a process for the production of images by electroinitiated polymerisation, followed by exposure to actinic radiation.

Conventionally, production of an image by means of photopolymerisation is achieved by coating a support with a solution of a solid photopolymerisable substance in a volatile organic solvent, evaporating the solvent to leave a solid layer of the photopolymerisable substance, and irradiating this layer through a negative so that polymerisation is effected in the irradiated areas. The unphotopolymerised portions of the layer are then removed by means of a suitable solvent, this stage being termed 'development'. After development the exposed surface from which unphotopolymerised material has been removed may be etched to form a printing plate or printed circuit.

Images have also been made by a similar process but in which the photopolymerisable material is replafced by a positive photoresist. This is a material that is rendered more soluble in a developing solvent by exposure to actinic radiation. Irradiation through an image-bearing transparency, followed by development, therefore leads to formation of a positive image.

For accurate image formation it is desirable to have as thin a coating as possible of the photosensitive material, i.e. the material that, on exposure to actinic radiation, undergoes a change in solubility, becoming more, or less, soluble in developing media. The need for thin coatings of photosensitive material is dictated by the need to minimise light scatter from the deposited film. This scatter is proportional to the thickness of the film, so that, if the film becomes too thick, very fine lines cannot be reproduced. However, the coating on a surface must be free from pinholes and other minor blemishes, since these would mar the printing plate or printed circuit that is produced. The application of very thin, but blemish-free, coatings presents serious problems, these problems being further increased when the surface to which the coating is applied has even slight irregularities or where it is a plate requiring coating on both sides and/or having holes which must also be coated.

A further requirement of the photosensitive layer is that it should solidify prior to exposure to actinic radiation. As mentioned above, this is usually achieved by the application of an inherently solid resin in solution in a volatile solvent which is then evaporated. The application of films by this method can give rise to slight imperfections due to the formation of a solid 'skin' of photosensitive material through which residual solvent has to pass, giving rise to pinholing. If, however, an inherently liquid or semi-liquid photosensitive material is applied, i.e., a solvent-free liquid, defects can occur due to composition flow after image formation. Further, such compositions are not easy to use since transparencies or other image-forming materials cannot be placed in direct contact with the composition due to its inherent tack.

There is therefore a need for a method of obtaining an inherently solid, photosensitive resin in the form of a very thin, blemish-free layer on a substrate, that is effective whatever the shape of the substrate. In the method of this invention, a solid, polymerised, but still photosensitive layer is formed on an electrode immersed in a solution or dispersion of a liquid photosensitive composition which further contains an agent that effects rapid polymerisation of the composition under the conditions, whilst leaving it still photosensitive. Electroinitiated polymerisation occurs on the electrode that then serves as substrate for the photosensitive material during exposure to actinic radiation. The thickness of the deposited polymerised layer is easily controlled by modification of the deposition conditions, very thin coatings being possible. Since this is an electrolytic process, all conducting surfaces of the substrate are coated, whether contoured or smooth, and including any holes. It has further been found that solvent entrapment is minimal, so minimising the pinholing defects that are common when conventional deposition methods, involving evaporation of solvents, are used.

The application of a photosensitive layer by electrodeposition is known. For example British Patent Specification No. 1 489 402 describes photocurable resin compositions comprising certain vinyl and vinylidene resins having free acid groups linked to the main chain and states that these compositions may be applied by electrodeposition to metallic substrates. Further, in U.S. Pat. No. 3 738 835 there are described photoresist compositions that are deposited by electrophoresis onto a metal substrate from emulsions containing, as photosensitive component, a polychloroprene and a sensitiser, and, to eliminate tackiness in the photopolymer, a polymeric resin binder, such as an epoxy resin partially cured with dicyandiamide. The emulsions further contain stabilisers, wetting agents, surfactants, N-methyl-2-pyrrolidone and triethanolamine. The photoresist composition is merely deposited from the emulsion onto the substrate, no polymerisation or curing reaction taking place during the deposition process. In order that the resin binder is a solid, when an epoxy resin is used, it requires partial polymerisation in a separate step prior to incorporation in the emulsion. Since this step gives a product that is not only solid but also insoluble, it is a feature of this process that the compositions are deposited from an emulsion of the components. Deposition from a true solution is not possible.

In addition, U.S. Pat. No. 4,416,752 describes a method for electroinitiating cationic polymerisation on the surface of a metal substrate. The substrate is made the anode in an electrolysed mixture of a cationically polymerisable organic material, such as an epoxy resin, and an aryliodonium or arylsulphonium salt, such as the hexafluorophosphate.

These specifications do not describe a process whereby a solid photoresist is formed by polymerisation on the surface of a substrate which is acting as an electrode. It is an advantage of the present method that the material that polymerises under the electroinitiated polymerisation conditions can be a standard commercial liquid resin. This requires no special modification to render it electrodepositable, since it is the polymerisation agent that migrates to, and is activated at, the electrode. The conventional resin solidifies on contact with the electrode due to liberation of a polymerisation species, so that resin itself can be quite inert electrically.

Accordingly, this invention provides a process for the production of an image on a substrate which comprises
(i) inserting the substrate as an electrode into a liquid composition comprising
 (A) a cationically polymerisable material,
 (B) a polymerising agent for (A) which is activated by an electric current, and (c) a photosensitive material, (ii) passing an electric current through the liquid composition between the substrate and another electrode, such that a photosensitive layer of essentially solid, polymerised material is deposited on the surface of the substrate, (iii) removing the substrate from the liquid composition, (iv) exposing the photosensitive layer to actinic radiation in a predetermined pattern so as to effect a difference in solubility between exposed parts and unexposed parts of the layer, and (v) removing more soluble parts of the layer by treatment with a solvent, leaving less soluble parts of the layer on the substrate.

The phrase "exposing... in a predetermined pattern" includes both exposure through an image-bearing transparency and exposure to an energy beam such as a laser beam moved as directed by a computer to form an image.

The liquid composition used in accordance with the present invention may comprise a mixture of one or more substances (A) which are exclusively cationically polymerisable with one or more substances (C) which are exclusively photosensitive. Alternatively, it may comprise one or more "dual-functional" substances, that is, substances that are both cationically polymerisable and photosensitive, such dual activity being associated either with different groups on the same molecule or with groups that are the same but are capable of both electroinitiated cationic polymerisation and photopolymerisation; in this embodiment, (A) and (C) are the same. In a further alternative, the composition may comprise a mixture of one or more such dual-functional substances with one or more exclusively cationically polymerisable substances and/or one or more exclusively photosensitive substances.

The cationically polymerisable material (A) may be, for example, a cyclic ether such as an oxetane or a tetrahydrofuran, a cyclic ester such as a lactone, an episulphide such as ethylene sulphide or an episulphide resin, a vinyl monomer such as a vinyl ether, a styrene or a vinyl carbazole, or a vinyl prepolymer. Preferably (A) is a 1,2-epoxide, such as ethylene oxide, propylene oxide, a monoglycidyl ether or an epoxide resin, a phenoplast, an aminoplast such as a urea-formaldehyde or melamine-formaldehyde resin, or a cyclic vinyl ether. Especially preferred cationically polymerisable materials are cycloaliphatic epoxide resins such as 3,4-epoxycyclohexylmethyl 3,4'-epoxycyclohexanecarboxylate and its 6,6'-dimethyl derivative, ethylene glycol bis(3,4-epoxycyclohexanecarboxylate), bis(3,4-epoxycyclohexylmethyl)adipate, dicyclopentadiene dioxide and vinylcyclohexane dioxide, monoglycidyl ethers such as isooctyl glycidyl ether and phenyl glycidyl ether, polyglycidyl ethers, which may have been advanced, of polyhydric alcohols such as 1,4-butanediol and diethylene glycol and of polyhydric phenols such as 2,2-bis(4-hydroxyphenyl)propane and phenol-aldehyde novolaks, cyclic vinyl ethers containing a dihydropyran residue, such as 3,4-dihydro-2H-pyran-2-ylmethyl 3,4-dihydro-2H-pyran-2-carboxylate, and phenol-formaldehyde resols. Mixtures of two or more cationically polymerisable materials can be used.

Suitable polymerising agents (B) for the polymerisable material (A) include salts, and complexes of a Lewis acid with an organic material, that liberate a polymerising species on electrolysis. Salts that may be used include those of formula

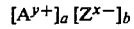

$$[A^{y+}]_a [Z^{x-}]_b \qquad \text{I}$$

where $A^{y+}$ denotes a cation which is preferably a metal, a metal complex, an organometallic, a heterocycle, ammonium, a sulphonium, an iodonium, a sulphoxonium, an iodosyl, a substituted ammonium, or a phosphonium ion, $Z^{x-}$ denotes an anion of a protic acid, and a, b, x, and y each denote 1, 2, or 3, such that (ay) is the same as (bx).

Suitable cations $A^{y+}$ are those of metals, especially alkali or alkaline earth metals, such as sodium, potassium, magnesium or calcium, ammonium, substituted phosphonium of formula

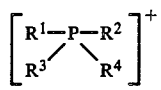

$$\left[ \begin{array}{c} R^1-P-R^2 \\ R^3 \diagup \diagdown R^4 \end{array} \right]^+ \qquad \text{II}$$

and substituted ammonium of formula

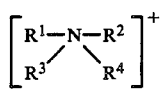

$$\left[ \begin{array}{c} R^1-N-R^2 \\ R^3 \diagup \diagdown R^4 \end{array} \right]^+ \qquad \text{III}$$

where $R^1$, $R^2$, $R^3$ and $R^4$, which may be the same or different, represent alkyl, alkenyl, aryl, aralkyl, cycloalkyl, or cycloalkylalkyl groups which may be substituted or $R^1$ and $R^2$, and/or $R^3$ and $R^4$, together with the nitrogen or phosphorus atom to which they are attached, form a heterocyclic ring which may contain one or more additional hetero atoms.

Other suitable cations $A^{y+}$ include sulphonium cations, including triaryl and arylalkyl sulphonium cations such as triphenylsulphonium and phenyldimethylsulphonium, iodonium cations, especially diaryliodonium cations such as diphenyliodonium, bis(3,4-dimethylphenyl)iodonium and di-(o-tolyl)iodonium, sulphoxonium cations including triaryl, trialkyl, arylalkyl, aracylalkyl and acylalkyl sulphoxonium cations such as triphenylsulphoxonium, trimethylsulphoxonium, phenyldimethyl, phenacyldimethyl and acetylmethyldimethylsulphoxonium, iodosyl cations, especially diaryliodosyl cations such as diphenyliodosyl, heterocyclics, such as 2,4,6-alkyl or aryl pyrylium cations, complexed metal cations such as transition metal ammonium or amine complex cations, and organometallic cations such as $\eta^5$-cyclopentadienyltricarbonyl, $\eta^6$-arene tricarbonyl, $\eta^7$-cycloheptatrienyl tricarbonyl, bis($\eta^5$-cyclopentadienyl), bis($\eta^6$-arene), and ($\eta^6$-arene) ($\eta^5$-cyclopentadienyl) transition metal cations.

Suitable anions $Z^{x-}$ are those derived from organic carboxylic acids, such as acetates and trifluoroacetates, those derived from organic sulphonic acids $Y-SO_3H$, where Y denotes an aliphatic, aromatic or aliphatic-substituted aromatic group, preferably of 1 to 20, 5 to 20 or 6 to 20 carbon atoms, respectively, particularly an alkyl, aryl or aralkyl group, any of which may be substituted by one or more halogen atoms, such as methanesulphonates, benzenesulphonates, toluene-p-sulphonates, and trifluoromethanesulphonates, and those derived from inorganic acids, typically halides, such as fluorides, chlorides, and bromides, halates, such as iodates, perhalates, such as perchlorates, and also nitrates, sulphates, hydrogen sulphates, phosphates, hydrogen phosphates, and complex anions such as pentafluorohydroxoantimonates and those of formula $MQ_d-$, where M represents an atom of a metal or metalloid, selected from boron, phosphorus, antimony and arsenic, Q represents a halogen atom, and d is an integer of from 4 to 6 and is one more than the valency of M.

Preferred salts used in the process of this invention are sodium, potassium, ammonium, substituted phosphonium and substituted ammonium salts of formulae II and III in which $R^1$, $R^2$, $R^3$ and $R^4$ represent the same or different unsubstituted alkyl groups of up to 6 carbon atoms, aralkyl groups of from 7 to 10 carbon atoms, or aryl groups of 6 to 10 carbon atoms, trimethylsulphoxonium, triphenylsulphonium, diphenyliodonium, diphenyliodosyl and $\eta^6$-isopropylbenzene)($\eta^5$-cyclopentadienyl)iron (II) salts having anions that are chloride, perchlorate, acetate, tetrafluoroborate, hexafluorophosphate, hexafluoroarsenate or hexafluoroantimonate ions. Particularly preferred salts are potassium hexafluorophosphate, tetramethylammonium hexafluoroantimonate, trimethylsulphoxonium and triphenylsulphonium hexafluoroantimonates, and ($\eta^6$-isopropylbenzene)($\eta^5$-cyclopentadienyl)iron (II) hexafluoroantimonate.

Lewis acid complexes that may be used as the polymerising agent include those of boron trifluoride, boron trichloride, aluminium trichloride, antimony trichloride and stannic chloride with an alcohol, ether, acid, amine, amide, ester, or tri-substituted phosphine. Preferred complexes are those of boron trifluoride with amines, which can be N-heterocycles, amine-substituted heterocycles, aliphatic, cycloaliphatic, or araliphatic, and phosphines substituted by three aliphatic or aromatic groups. Particularly preferred complexes are those of boron trifluoride with pyridine, piperidine, mono-, di-, and tri-ethylamine, mono-, di-, and tri-methylamine, isophoronediamine, benzylamine, cyclohexylamine, N,N,N',N'-tetramethylhexamethylenediamine, trimethylphosphine and triphenylphosphine.

The nature of the polymerisable material (A) and that of the agent (B) are selected to give effective polymerisation. Matching a cationically polymerisable material with a suitable polymerising agent is well within the knowledge of those skilled in the art of polymerising cationically polymerisable compositions. For example, the salts containing anions derived from organic carboxylic acids, organic sulphonic acids, and inorganic acids, especially acetates, trifluoroacetates, methanesulphonates, benzenesulphonates, toluene-p-sulphonates, trifluoromethanesulphonates, fluorides, chlorides, bromides, iodates, perchlorates, nitrates, sulphates, hydrogen sulphates, phosphates or hydrogen phosphates are capable of curing phenoplasts, such as phenolformaldehyde resins, and aminoplasts, such as urea-formaldehyde and melamine-formaldehyde resins. Salts containing a metal halogenide or metalloid halogenide anion and the Lewis acid complexes are capable of curing epoxide resins or episulphide resins, or polymerising mono-1,2-epoxides, monoepisulphides or vinyl ethers.

The photosensitive material (C) may be photocurable, giving a negative image, or photosolublisable to give a positive image. Suitable photocurable materials include those in which cure is effected by direct activation of photosensitive groups through irradiation and those in which the irradiation activates a suitable initiator molecule which then activates photopolymerisable groups.

Photocurable materials having photosensitive groups are well known and include those having one or more, and preferably at least two, groups which are azido, coumarin, stilbene, maleimido, pyridinone, chalcone (including propenone and pentadienone) or anthracene groups, or acrylic ester groups which are substituted in their 3-position by a group having ethylenic unsaturation or aromaticity in conjugation with the ethylenic double bond of the acrylic group.

Materials in which photocure is effected by activation of a photoinitiator which then activates curable groups include epoxide resins, phenolic resins, urea-formaldehyde resins, cyclic ethers, cyclic esters, cyclic sulphides, cyclic amines and organosilicon cyclics in combination with a radiation-sensitive aromatic 'onium salt, such as diazonium, sulphonium, iodonium, and sulphoxonium salts, or a radiation-sensitive aromatic iodosyl salt, and full and partial esters of acrylic and methacrylic acid with aliphatic monohydric alcohols, glycols and higher functional polyols or with a compound containing one or more epoxide groups and esters formed by reaction of an epoxide with an adduct of a hydroxyalkyl acrylate or methacrylate with a saturated or unsaturated polycarboxylic acid anhydrate.

It will be appreciated that some of the photocurable materials that may be used as (C) are identical to mixtures of the cationically polymerisable material (A) and the polymerising agent (B). It has been found that where the polymerising agent (B) may be activated by both an electric current and by actinic radiation, and the initial solidification takes place on the surface of the substrate as described, there is sufficient unreacted polymerising agent remaining on the substrate for it to function as the photocuring agent on exposure to actinic radiation.

Photosolubilisable materials that may be used as (C) include o-nitrobenzaldehyde, the polyoxymethylene polymers described in U.S. Pat. No. 3,991,033, the o-nitrocarbinol esters described in U.S. Pat. No. 3,849,137, the o-nitrophenyl acetals, their polyesters, and end-capped derivatives described in U.S. Pat. No. 4,086,210, sulphonate esters of aromatic alcohols containing a carbonyl group in a position alpha or beta to the sulphonate ester group, N-sulphonyloxy derivatives of an aromatic amide or imide, quinone diazides, such as those described in British Patent Specifications Nos. 1 227 602 and 1 329 888, and resins containing benzoin groups in the chain, such as those described in U.S. Pat. No. 4,368,253.

The preferred photocurable materials used as component (C) are epoxide resins, especially cycloaliphatic epoxide resins and polyglycidyl ethers of polyhydric alcohols and phenols, with a radiation sensitive aromatic 'onium or iodosyl salt, esters of acrylic or methacrylic acid, especially esters with cycloaliphatic epoxide resins and polyglycidyl ethers of polyhydric alcohols and phenols, and chalcones.

Photocurable materials that also contain different groups polymerisable during the electroinitiated polymerisation, i.e. dual-functional materials that may function as both component (A) and component (C), include epoxy group-containing acrylates, methacrylates, chalcones and cinnamates, methylol group-containing acrylates, methacrylates, chalcones and cinnamates and vinyl group-containing chalcones. Such dual-functional materials may be prepared by reacting a substance having a cationically polymerisable group with a substance having a photocurable group, the substances having mutually reactive groups. When one of the substances has two or more similar reactive groups which are cationically polymerisable groups or photocurable groups, as in the case of an epoxide resin, and the formation of the dual functional material involves use of that substance in a stoichiometric excess so that only part of those groups is reacted, such a method does not usually give a 100% yield of a compound containing both types of group. In practice a mixture of the unreacted substance present in excess, fully reacted material and dual functional material is formed, i.e. a mixture of entirely cationically polymerisable, entirely photocurable and dual functional materials is formed. Since such mixtures may be used successfully in the process of the invention, the fact that the reaction product is a mixture is of no consequence.

Thus a suitable dual functional material can be prepared by reacting an epoxide resin with less than the stoichiometric amount of a carboxylic acid or phenol having a photocurable group. Other suitable dual functional materials can be prepared by subjecting a substance containing a photocurable group such as an acrylate, methacrylate or chalcone group, and also a carboxyl or alcoholic or phenolic hydroxyl group, to a conventional glycidylation reaction to introduce an epoxide group.

Especially preferred photocurable materials are epoxide resins, particularly those described above as preferred cationically polymerisable materials, mixed with a triarylsulphonium or diaryliodonium or diaryliodosyl hexafluorophosphate, tetrafluoroborate, or hexafluoroantimanate, full and partial esters of acrylic and methacrylic acid with glycols, such as ethylene glycol, triethylene glycol, and tetraethylene glycol, esters formed by reaction of acrylic or methacrylic acid with a mono- or poly-glycidyl ether of a mono or polyhydric alcohol or phenol, a cycloaliphatic epoxide resin or a N-glycidyl hydantoin, and esters formed by reaction of such epoxides with an adduct of a hydroxyalkyl acrylate or methacrylate and an anhydride, especially succinic, maleic, or phthalic anhydride, and chalcones containing a group of formula

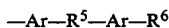    IV where
Ar represent an optionally substituted phenylene group,
R$^5$ represents a group of formula

    V or

    VI

R$^6$ represents a valency bond or a hydrogen atom,
R$^7$ represents a hydrogen atom, an alkyl group of 1 to 4 carbon atoms, or a phenyl group, or the two indicated groups R$^7$ conjointly denote a polymethylene chain of 2 to 4 methylene groups,
R$^8$ denotes a hydrogen atom, an alkyl group of 1 to 4 carbon atoms, or a phenyl group, and
m and n are each zero, 1, or 2, with the proviso that they are not both zero.

Preferred dual functional materials having a cationically polymerisable group and a different photocurable group on the same molecule are reaction products of epoxide resins, especially cycloaliphatic epoxide resins and polyglycidyl ethers of polyhydric phenols such as 2,2-bis(4-hydroxyphenyl)propane, bis(4-hydroxyphenyl)methane and novolac resins, with less than the stoichiometric amount of acrylic, methacrylic or cinnamic acid, or a phenol containing a chalcone group, especially one of formula IV. Other preferred such dual functional materials are glycidyl ethers of phenols containing a chalcone group, particularly one of formula IV, for example 1,5-bis(4-glycidyloxyphenyl)penta-1,4-dien-3-one. Further preferred materials are vinyl ether group-containing derivatives of phenols containing a chalcone group, especially one of formula IV, prepared by reacting the phenol, such as 1,5-bis(4-hydroxyphenyl)penta-1,4-dien-3-one, with a haloalkylvinyl ether such as 2-chloroethylvinyl ether.

Photosolubilisable materials that are preferred for use as the photosensitive material (C) include quinone diazides, particularly benzoquinone- and naphthoquinone diazide sulphonic esters of phenols, especially of phenolic novalak resins, such as those described in British Patent Specifications Nos. 1 227 602, 1 329 888, and 1 330 932, and in U.S. Pat. No. 4,306,010. These esters can be prepared by reaction of a phenolic novolak resin with the quinone diazide sulphonic acid or esterifying derivative thereof such as the sulphonyl halide. Usually, at least 25%, preferably at least 50%, of the phenolic hydroxyl groups are left unesterified. Preferred esters are 1,2-benzoquinone-2-diazide-4-sulphonic and 1,2-naphthoquinone-2-diazide-4- and 5-sulphonic esters of phenolic novolak resins derived from formaldehyde and phenol, o-, m- or p-cresol, o-, m- or p-tert.butylphenol, o-, m- or p-octylphenol, or mixtures of two or more of these phenols. Especially preferred esters are the 1,2-naphthoquinone-2-diazide-5-sulphonic esters of a novolak resin prepared from formaldehyde and a mixture of m- and p-cresols, and a novolak resin prepared from a mixture of phenol and p-tert.butylphenol.

Other preferred photosolubilisable materials for use as (C) are o-nitrophenyl acetals prepared from an o-nitrobenzaldehyde and a dihydric alcohol, polyesters of such acetals prepared by reaction of the acetals with a polycarboxylic acid or reactive derivative thereof such as an anhydride, and end-capped derivatives of such acetals prepared by reacting the acetals with a carboxylic acid or reactive derivative thereof. Preferred are acetals derived from o-nitrobenzaldehyde and a linear alkylene glycol in which the alkylene group has 4 to 15 carbon atoms which may be interrupted by at least one oxygen atom, or a glycol containing a cycloaliphatic ring of 4 to 7 carbon atoms, such as cycloalkylene glycol or a cycloalkylenealkylene glycol, and polyester and end-capped derivatives of such acetals.

Preferred linear glycols from which the acetals may be derived are 1,4-butanediol, 1,5-pentanediol, 1,6-hexanediol, 1,7-heptanediol, diethylene and dipropylene glycols and triethylene and tripropylene glycols. Preferred glycols having a cycloaliphatic ring are 2,2,4,4-tetramethyl-1,3-cyclobutanediol, bis(4-hydroxycyclohexyl)methane, 1,4-cyclohexanediol, 1,2-bis(hydroxymethyl)cyclohexane and, especially, 1,4-bis(hydroxymethyl)cyclohexane.

Preferred polyesteracetals are those prepared by reaction of the preferred acetals described above with an aromatic dicarboxylic or tricarboxylic acid or anhydride thereof, such as phthalic, terephthalic, and trimellitic acids and their anhydrides, and mixtures of two or more thereof. An especially preferred polyesteracetal is that prepared by reacting an acetal derived from o-nitrobenzaldehyde and 1,4-bis(hydroxymethyl)cyclohexane with trimellitic anhydride. Preferred end-capped polyacetals are those prepared by reaction of the preferred acetals described above with a monobasic carboxylic acid or reactive derivative thereof, such as acetic and benzoic acids and their chlorides.

Further preferred photosolubilisable materials for use as (C) are resins, particularly epoxide resins, polyurethanes and polyesters, containing benzoin groups in the chain, such as those described in U.S. Pat. No. 4,368,253. Preferred among these benzoin-containing resins are those containing benzoin groups in which the hydroxyl group on the carbon adjacent to the carbonyl group is etherified, that is benzoin alkyl ether groups where the alkyl group has 1 to 4 carbon atoms. Especially preferred are epoxide resins prepared by reacting a dihydroxybenzoin alkyl ether with a diglycidyl compound, particularly a diglycidyl ether of a dihydric alcohol or phenol or a diglycidylhydantoin. Epoxide resins containing benzoin groups can be used as dual-functional materials in the process of this invention, the epoxide groups providing cationic polymerisation in step (ii) and the benzoin groups providing photosolubilisation in step (iv).

A hydrophilic polymer can be included in the liquid composition to facilitate the production of an image which is developable in water. Suitable hydrophilic polymers include polyalkylene glycols such as polyethylene glycol, polyacrylamides, polyvinyl pyrrolidones and, preferably, polyvinyl alcohols (hydrolysed polyvinyl acetates). When used, the hydrophilic polymer is generally present in an amount of 0.5 to 20% by weight of the composition.

The substrate on which an image is produced by the process of this invention must, of course, have an electrically conductive surface. It may be of carbon, silicon, a conductive plastics material such as a thermoset resin containing conductive particles or, preferably, it is of metal such as aluminium, copper or tinplate, either as a solid metal sheet or as a metal-faced laminate.

Step (ii) of the process of the invention is conveniently effected by mixing the polymerisable material (A), the polymerising agent (B) and the photosensitive material (C) in an aqueous, organic or aqueous organic solvent in an electrolytic bath, inserting the substrate as the anode and a similar or different conductive material as the cathode, and passing a current until a suitable thickness of polymerised material has been deposited on the anode. This is then removed from the bath and dried, usually at elevated temperature, particularly within the range 70°–110° C. By reversing the current, or by using an alternating current, polymerised material can be deposited on both electrodes.

The total combined weight of the substances constituting (A) and (C) is generally from 5 to 80%, preferably 10 to 50%, of the weight of the liquid composition (including solvent). When the composition comprises different substances (A) and (C), the weight percentage of (A) in the mixture of (A) and (C) is usually from 10 to 90%, preferably from 25 to 75%. When the composition comprises a mixture of dual functional material with one or more cationically polymerisable substances (A) and/or one or more different photosensitive substances (C), the weight percentage of dual functional material in the mixture may be from 10 to 90%. The amount of the polymerising agent (B) used may vary between fairly wide limits but is normally 0.1% to 15% based on the weight of polymerisable material (A) and/or dual functional material. The composition is preferably at ambient temperature, but it may be heated or cooled if desired, temperatures within the range 0° C. to 80° C. having been found to be satisfactory. Suitable organic solvents for this process include ketones, such as acetone, methyl ethyl ketone and methyl isobutyl ketone, halogenated hydrocarbons such as dichloromethane, chloroform and tetrachloroethane, nitro compounds such as nitromethane, nitroethane and nitrobenzene, pyrrolidones such as N-methylpyrrolidone, alcohols such as 2-ethoxyethanol and 2-butoxyethanol, mixtures of two or more thereof and, where water-miscible, mixtures of one or more thereof with water. The solvent is generally used in an amount of 10–90%, preferably 50–90%, by weight of the composition. Voltages used are usually within the range 5 V to 150 V, preferably 5 V to 100 V, especially 10 V to 50 V, and the current required to effect a deposit from about 1 to about 30 micrometers thick is usually within the range 10 mA to 10 A.

Preferably, the exposure to actinic radiation is effected in the presence of a photosensitiser such as quinone; a diphenylcarbinol; 5-nitroacenaphthene; a 2-substituted thioxanthone; a diphenylmethane; an alpha-haloacetophenone such as p-tert.butylphenyl trichloromethyl ketone; a photoredox catalyst such as a mixture of a phenothiazine dye (e.g., methylene blue) or a substituted quinoxaline with an electron-donating reducing agent such as a sulphinic acid or salt of a sulphinic acid, a phosphine, an arsine, or thiourea; a benzophenone; a benzil dialkyl ketal such as benzil dimethyl ketal (i.e., alpha-methoxybenzoin methyl ether); benzoin; a benzoin alkyl ether; and an O-alkoxycarbonyl derivative of an oxime of benzil or 1-phenylpropane-1,2-dione, such as benzil (O-ethoxycarbonyl)-alpha-monoxime and 1-phenylpropane-1,2-dione 2-(O-ethoxycarbonyl)oxime. Preferred sensitisers are Michler's ketone (i.e., 4,4'-bis(-dimethylamino)benzophenone), benzoin n-butyl ether and mixtures of these two; metal salts of 2-(m- or p-methoxyphenyl)quinoxaline-6'- or -7'-sulphonic acids mixed with a metal salt of toluene-p-sulphonic acid; 1-phenylpropane-1,2-dione 2-(O-ethoxycarbonyl)oxime, benzil dimethyl ketal and mixtures of these two; and 2-chlorothioxanthone and its mixtures with benzil dimethyl ketal. Usually from 0.1 to 20%, and preferably from 0.5 to 15%, by weight of the sensitiser, calculated on the weight of the photosensitive material (C) and/or dual functional material, is employed.

In photoimaging the photosensitive layer in accordance with the invention, actinic radiation of wavelength 200 to 600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure will depend upon a variety of factors which include, for example, the individual compounds used, the proportion of these compounds in the composition, the type of light source, and its distance from the composition. Suitable times may be readily determined by those familiar with photoimaging techniques.

The developer used in the present process is selected according to the nature of the photosensitive material (C) or the photosensitive residue of the dual functional material, and may be water, an aqueous or aqueous organic solution of an acid or base or an organic solvent or mixture of solvents. Suitable acid solutions include those of acetic, lactic, glycolic or toluene-p-sulphonic acids, while suitable basic solutions include those of sodium or potassium hydroxide or carbonate. Suitable organic solvents that may be used include cyclohexanone, 2-ethoxyethanol, toluene, acetone, tetrahydrofuran, 1,1,1-trichloroethane, ethanol and mixtures of two or more of these.

The following Examples illustrate the invention. All parts and percentages are by weight. Voltages are D.C. voltages.

The resins used in these Examples are prepared as follows:

RESIN I 2,2,-Bis(4-glycidyloxyphenyl)propane, having an epoxide content of 5.2 equivalents/kg (100 g) and 2,6-di-tert.butyl-4-methylphenol (0.1 g) are stirred together and heated to 100° C. To this mixture there is slowly added, over 1½ hours, a mixture of methacrylic acid (22.8 g), chromium (III) tris octanoate (0.05 g) and 2,6-di-tert.butyl-4-methylphenol (0.2 g). On complete addition the mixture is stirred at 100° C. for a further 4 hours and cooled. The product, Resin I, consists of a mixture of 2-(4-glycidyloxyphenyl)-2-(4-(2-hydroxy-3-methacryloyloxypropoxy)phenyl)propane, 2,2-bis(4-glycidyloxyphenyl)propane, and 2,2-bis(4-(2-hydroxy-3-methacryloyloxypropoxy)phenyl)propane, and has an epoxide content of 1.92 equivalents/kg.

RESIN II 3,4-Epoxycyclohexylmethyl 3',4'-epoxycyclohexane carboxylate having an epoxide content of 7.2 equivalents/kg (100 g) and 2,6-di-tert.butyl-4-methylphenol (0.1 g) are stirred together and heated to 80° C. To this mixture there is slowly added, over 30 minutes, a mixture of acrylic acid (25.9 g), chromium (III) tris octanoate (0.07 g) and 2,6-di-tert.butyl-4-methylphenol (0.2 g). On complete addition the mixture is stirred at 80° C. for a further 2 hours and cooled. The product, Resin II, consists of a mixture of compounds of the general formula

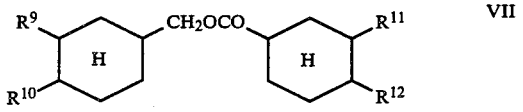
VII where
R$^9$ and R$^{10}$, together with the carbon atoms to which they are attached, form an epoxy group or one denotes a hydroxyl group and the other denotes an acryloyloxy group and R$^{11}$ and R$^{12}$, together with the carbon atoms to which they are attached, form an epoxy group or one denotes a hydroxyl group and the other denotes an acryloyloxy group. This resin has an epoxide content of 2.4 equivalents/kg.

RESIN III 1,5-Bis(4-hydroxyphenyl)penta-1,4-dien-3-one (26.6 parts) is dissolved in dimethylsulphoxide (100 parts) and powdered sodium hydroxide (12 parts) added. The mixture is stirred at room temperature for 30 minutes and is then heated at 80° C. for 1 hour. 2-Chloroethylvinyl ether (32 parts) is added to the mixture over 30 minutes, maintaining the temperature between 75° and 80° C., and the mixture is then stirred at 80° C. for 5 hours and allowed to stand overnight at room temperature. It is poured into cold water (500 ml) and the resultant precipitate is filtered off. Recrystallisation from ethanol gives 1,5-bis(4-vinyloxyethoxyphenyl)penta-1,4-dien-3-one (28.9 parts), melting point 124°-125° C.

RESIN IV

This denotes a resin having a molecular weight of 1450 made by reacting a novolak, prepared from 3 moles of phenol and 1 mole of p-tert.butylphenol and 3.6 moles of formaldehyde, with 1,2-naphthoquinone-2-diazide-5-sulphonyl chloride so as to esterify 12% of the phenolic hydroxyl groups.

RESIN V o-Nitrobenzaldehyde (100.6 g), 1,4-bis(hydroxymethyl)cyclohexane (192 g), and toluene-p-sulphonic acid (0.2 g) are mixed in a flask with dichloromethane (600 g) and heated to reflux under nitrogen. Water which forms is removed using a Dean and Stark trap, and, when no further water is evolved, the solvent is removed by distillation. The mixture is then stirred at 140° C. for 16 hours, and finally any remaining volatile material is removed at 140° C. at a pressure of 16 mm Hg (=2.13 kPa). The residue is cooled and diluted with xylene (140 g) to give a solution having a solids content of 66%.

The solution from the above reaction (63.9 g) and trimellitic anhydride (19.2 g) are stirred together under reflux, water formed being removed continuously using a Dena and Stark trap. After 3 hours the acid value of the reaction mixture has fallen to 1.20 equivalents/kg and a vacuum is applied in order to eliminate the xylene. The residue is poured into an aluminium tray to give a dark green solid, softening at 90° C., which is ground to a powder. Resin V contains the following repeating unit:

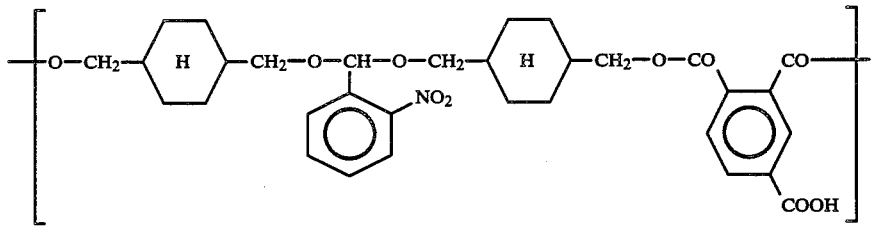

RESIN VI

A mixture of 4,4'-dihydroxybenzoin n-butyl ether (5.0 g), 1,4-butanediol diglycidyl ether (epoxide content 8.64 equivalents/kg, 3.5 g), N,N'-diglycidyl-5,5-dimethylhydantoin (epoxide content 7.88 equivalents/kg, 1.4 g) and tetramethylammonium chloride (0.02 g) are dissolved in 2-ethoxyethanol (20.0 g). This solution is stirred at 135° C. for 2 hours, by which time the epoxide content has fallen to 0.70 equivalents/kg. The solution of an advanced epoxy resin is cooled and is then ready for use.

RESIN VII

N,N'-Diglycidyl-5,5-dimethylhydantoin of epoxide content 7.88 equivalents/kg (3.58 g), 4,4'-dihydroxybenzoin n-butyl ether (2.8 g) and N-benzyldimethylamine (0.02 g) are dissolved in 2-ethoxyethanol (15 g). The resulting solution is heated at 135° C. for 2 hours, by which time the epoxide content has fallen to 0.90 equivalents/kg. The solution of an advanced epoxy resin is cooled and is then ready for use.

EXAMPLE 1

Resin I (1 part), benzil dimethyl ketal (0.03 part) and potassium hexafluorophosphate (0.01 part) are dissolved in a mixture of dichloromethane (1 part) and acetone (1 part) in an electrolytic bath. A tinplate anode and a tinplate cathode are inserted and an electric current is passed for 30 seconds at 30 volts to deposit a polymerised layer on the anode. The anode is removed from the bath and dried for 5 minutes at 90° C. This results in a tack-free layer 16 micrometers thick. This tack-free layer is irradiated through a negative with 5000 w metal halide lamp at a distance of 75 cm for one minute. Development with toluene gives a clear negative image.

EXAMPLE 2

Resin II (1 part), benzil dimethyl ketal (0.03 part) and potassium hexafluorophosphate (0.01 part) are dissolved in a mixture of dichloromethane (1 part) and acetone (1 part) in an electrolytic bath. A copper-clad laminate is inserted as anode and a sheet of tinplate as cathode. An electric current is passed for 2 seconds at 100 volts to deposit a polymerised layer on the anode. The anode is removed from the bath and dried for 5 minutes at 90° C. This results in a tack-free layer 8 micrometers thick. This tack-free layer is irradiated through a negative with a 5000 w metal halide lamp at a distance of 75 cm for two minutes. Development with a mixture of equal volumes of acetone and 1,1,1-trichloroethane gives a clear negative image.

EXAMPLE 3

2,2-Bis(4-glycidyloxyphenyl)propane having an epoxide content of 5.2 equivalents/kg (1 part) and triphenylsulphonium hexafluoroantimonate (0.03 part) are dissolved in a mixture of dichloromethane (1 part) and acetone (1 part) in an electrolytic bath. A copper-clad laminate anode and a tinplate cathode are inserted and a current is passed for 5 seconds at 30 volts to deposit a polymerised layer on the anode. The anode is removed from the bath and dried for 5 minutes at 90° C. This results in a tack-free layer 4 micrometers thick. This tack-free layer is irradiated through a negative with a 5000 w metal halide lamp at a distance of 75 cm for 5 minutes. Development with tetrahydrofuran gives a clear negative image.

EXAMPLE 4

2,2-Bis(4-glycidyloxyphenyl)propane having an epoxide content of 5.2 equivalents/kg (0.5 part), 2,2-bis(4(2-hydroxy-3-acryloyloxypropoxy)phenyl)propane (0.5 part), potassium hexafluorophosphate (0.02 part) and benzil dimethyl ketal (0.05 part) are dissolved in a mixture of acetone (1 part) and dichloromethane (1 part) in an electrolytic bath. A copper-clad laminate anode and a tinplate cathode are inserted and a current is passed for 20 seconds at 30 volts to deposit a polymerised layer on the anode. The anode is removed from the bath and dried for 5 minutes at 90° C. This results in a tack-free layer 7 micrometers thick. This tack-free klayer is irradiated through a negative with a 5000 w metal halide lamp at a distance of 75 cm for 5 minutes. On development with a mixture of toluene and tetrahydrofuran (volume ratio 8.5:1.5) a negative image is obtained.

EXAMPLE 5

1,5-Bis(4-glycidyloxyphenyl)penta-1,4-dien-3-one having an epoxide content of 5.26 equivalents/kg (0.7 part), 2,2-bis(4-glycidyloxyphenyl)propane having an epoxide content of 5.2 equivalents/kg (0.3 part) and trimethylsulphoxonium hexafluoroantimonate (0.03 part) are dissolved in N-methylpyrrolidone (3 parts) in an electrolytic bath. A current is passed through the solution between a copper-clad laminate anode and a tinplate cathode, for 60 seconds at 100 volts to deposit a polymerised layer on the anode. The anode is removed from the bath and dried for 5 minutes at 90° C. This results in a track-free layer 7 micrometers thick. This tack-free layer is irradiated through a negative with a 5000 w metal halide at a distance of 75 cm for 5 minutes. On developement with a mixture of ethanol and tetrahydrofuran (volume ratio 4:1) a negative image is obtained.

EXAMPLE 6

3,4-Epoxycyclohexylmethyl 3',4'-epoxycyclohexane carboxylate (1 part), ($\eta^6$-isopropylbenzene)($\eta^5$-cyclopentadienyl)iron (II) hexafluoroantimonate (0.1 part) and 2-chlorothioxanthone (0.05 part) are dissolved in acetone (2 parts) in an electrolytic bath. A current is passed through the solution between a copper-clad laminate anode and a tinplate cathode for 20 seconds at 30 volts to deposit a polymerised layer on the anode. The anode is removed from the bath and dried for 5 minutes at 90° C. This results in a tack-free layer 10 micrometers thick. This tack-free layer is irradiated through a negative with a 5000 w metal halide lamp at a distance of 75 cm for 5 minutres. On development with tetrahydrofuran a negative image is obtained.

EXAMPLE 7

Resin III (0.25 part), 3,4-dihydro-2H-pyran-2-yl methyl 3,4-dihydro-2H-pyran-2-carboxylate (0.5 part) and potassium hexafluorophosphate (0.03 part) are dissolved in a mixture of N-methyl pyrrolidone (3 parts) and acetone (0.25 part) in an electrolytic bath. A current is passed through the solution between a copper-clad laminate anode and a tinplate cathode for 30 seconds at 100 volts to deposit a polymerised layer on the anode. The anode is removed from the bath and dried for 10 minutes at 90° C. This results in a tack-free layer 5 micrometers thick. This tack-free layer is irradiated through a negative with a 5000 w metal halide lamp at a distance of 75 cm for 5 minutes. On development in toluene, using gentle rubbing, a negative image is obtained.

EXAMPLE 8

Resin IV (0.7 part), iso-octyl glycidyl ether (0.3 part) and potassium hexafluorophosphate (0.03 part) are dissolved in a mixture of 2-butoxyethanol (2.2 parts) and water (1 part) in an electrolytic bath. A current is passed through the solution between a copper-clad laminate anode and a tinplate cathode for 5 seconds at 30 volts to deposit a polymerised layer on the anode. The anode is removed from the bath and dried for 5 minutes at 90° C. This results in a tack-free layer 6 micrometers thick. This tack-free layer is irradiated through a negative with a 5000 w metal halide lamp at a distance of 75 cm for 2 minutes. On development in 2% sodium hydroxide solution, using gentle rubbing, a positive image is obtained.

EXAMPLE 9

Resin IV (0.7 part), 3,4-epoxycyclohexylmethyl 3',4'-epoxycyclohexane carboxylate (0.3 part) and boron trifluoride-ethylamine complex (0.03 part) are dissolved in 2-butoxyethanol (2 parts) is an electolytic bath. A current is passed through the solution between a copper-clad laminate anode and a tinplate cathode for 30 seconds at 100 volts to deposit a polymerised layer on the anode. The anode is removed from the bath and dried for 5 minutes at 90° C. This results in a tack-free layer 12 micrometers thick. This tack-free layer is irradiated through a negative with a 5000 w metal halide lamp at a distance of 75 cm for 2 minutes. On development in 2% sodium hydroxide solution, using gentle rubbing, a positive image is obtained.

EXAMPLE 10

Resin IV (0.7 part), 3,4-dihydro-2H-pyran-2-yl methyl 3,4-dihydro-2H-pyran-2-carboxylate (0.3 part) and tetramethylammonium hexafluoroantimonate (0.03 part) are dissolved in a mixture of 2-butoxyethanol (2 parts) and acetone (1 part) in an electrolytic bath. A current is passed through the solution between a copper-clad laminate anode and a tinplate cathode for 5 seconds at 30 volts to deposit a polymerised layer on the anode. The anode is removed from the bath and dried for 5 minutes at 90° C. This results in a tack-free layer 6 micrometers thick. This tack-free layer is irradiated through a negative with a 5000 w metal halide lamp at a distance of 75 cm for 2 minutes. On development in 2% sodium hydroxide solution, using gentle rubbing, a positive image is obtained.

EXAMPLE 11

Resin IV (0.7 part), 2,2-bis(4-glycidyloxyphenyl)propane having an epoxide content of 5.2 equivalents/kg (0.3 part) and potassium hexafluorophosphate (0.03 part) are dissolved in a mixture of 2-butoxyethanol (2 parts) and water (1 part) in an electrolytic bath. A current is passed through the solution between a copper-clad laminate anode and a tinplate cathode for 5 seconds at 30 volts to deposit a polymerised layer on the anode. The anode is removed from the bath and dried for 5 minutes at 90° C. This results in a tack-free layer 8 micrometers thick. This tack-free layer is irradiated through a negative with a 5000 w metal halide lamp at a distance of 75 cm for 2 minutes. On development in 2% sodium hydroxide solution, using gentle rubbing, a positive image is obtained.

EXAMPLE 12

Resin IV (0.7 parts), 1,4-bis(glycidyloxy)butane (0.3 part) and potassium hexafluorophosphate (0.03 part) are dissolved in a mixture of 2-butoxyethanol (2 parts) and water (1 part) in an electrolytic bath. A current is passed through the solution between a copper-clad laminate anode and a tinplate cathode for 5 seconds at 20 volts to deposit a polymerised layer on the anode. The anode is removed from the bath and dried for 5 minutes at 90° C. This results in a tack-free layer 8 micrometers thick. This tack-free layer is irradiated through a negative with a 5000 w metal halide lamp at a distance of 75 cm for 2 minutes. On development in 2% sodium hydroxide solution, using gentle rubbing, a positive image is obtained.

EXAMPLE 13

Resin V (0.3 part), 2,2-bis(4-glycidyloxyphenyl)propane having an epoxide content of 5.2 equivalents/kg (0.7 part) and potassium hexafluorophosphate (0.03 part) are dissolved in a mixture of 2-butoxyethanol (2.5 parts), water (1 part) and a 20% aqueous solution of potassium hydroxide (0.28 part) in an electrolytic bath. A current is passed through the solution between a copper-clad laminate anode and a tinplate cathode for 5 seconds at 100 volts to deposit a polymerised layer on the anode. The anode is removed from the bath and dried for 5 minutes at 90° C. This results in a tack-free layer 12 micrometers thick. This tack-free layer is irradiated through a negative with a 5000 w metal halide lamp at a distance of 75 cm for 5 minutes. On development in 2% sodium hydroxide solution, using gentle rubbing, a positive image is obtained.

EXAMPLE 14

Resin VI (1 part), resin VII (1 part) and potassium hexafluorophosphate (0.3 part) are dissolved in acetone (5 parts) in an electrolytic bath. A current is passed through the solution between a tinplate anode and a tinplate cathode for 2 seconds at 10 volts to deposit a polymerised layer on the anode. The anode is removed from the bath and dried for 5 minutes at 90° C. This results in a tack-free layer 5 micrometers thick. This tack-free layer is irradiated through a negative with a 5000 w metal halide lamp at a distance of 75 cm for 5 minutes. On development in 2% sodium hydroxide solution, using gentle rubbing, a positive image is obtained.

EXAMPLE 15

3,4-Epoxycyclohexylmethyl 3',4'-epoxycyclohexane carboxylate (1 part), a 13% solution in water of a polyvinyl alcohol (87–89% hydrolysed polyvinyl acetate) having a molecular weight of 125,000 (1 part), triphenylsulphonium hexafluoroantimonate (50% solution in propylene carbonate (0.06 part) and an ethoxylated nonylphenol surfactant (30 moles of ethylene oxide per mole of nonylphenol) (0.1 part) are dissolved in a mixture of water (2 parts) and 2-butoxyethanol (0.5 part) in an electrolytic bath. A current is passed through the solution between a copper-clad laminate anode and a tinplate cathode for 5 seconds at 30 volts to deposit a polymerised layer on the anode. The anode is removed from the bath and dried for 5 minutes at 90° C. This results in a tack-free layer 10 micrometers thick. This tack-free layer is irradiated through a negative with a 5000 W metal halide lamp at a distance of 75 cm for 5 minutes. On development in warm water (40° C.), using gentle rubbing, a negative image is obtained.

EXAMPLE 16

1,5-Bis(4-glycidyloxyphenyl)penta-1,4-dien-3-one (1 part) and potassium hexafluorophosphate (0.01 part) are dissolved in N-methylpyrrolidone (3 parts) in an electrolytic bath. A current is passed through the solution between a copper-clad laminate anode and a tinplate cathode for 30 seconds at 30 volts to deposit a plymerised layer on the anode. The anode is removed from the bath and dried for 5 minutes at 90° C. This results in a tack-free layer 8 micrometers thick. This tack-free layer is irradiated through a negative with a 5000 W metal halide lamp at a distance of 75 cm for 5 minutes. On development in a mixture of 1,1,1-trichloroethane and toluene (volume ratio 7:1), using gentle rubbing, a negative image is obtained.

What is claimed is:

1. A process for the production of an image on a substrate which comprises
   (i) inserting the substrate as an electrode into a liquid composition comprising
   (A) a cationically polymerizable material,
   (B) a polymerizing agent for (A) which is activated by an electric current, and
   (C) a photosensitive material,
   (ii) passing an electric current through the liquid composition between the substrate and another electrode, such that a photosensitive layer of essentially solid, polymerized material is deposited on the surface of the substrate,
   (iii) removing the substrate from the liquid composition,
   (iv) exposing the photosensitive layer to actinic radiation in a predetermined pattern so as to effect a difference in solubility between exposed parts and unexposed parts of the layer, and
   (v) removing more soluble parts of the layer by treatment with a solvent, leaving less soluble parts of the layer on the substrate.

2. A process according to claim 1, in which the liquid composition comprises
   (1) a mixture of one or more substances (A) which are exclusively cationically polymerizable with one or more substances (C) which are exclusively photosensitive, or
   (2) one or more dual functional substances which are both cationically polymerizable and photosensitive, present as both (A) and (C), or
   (3) a mixture of one or more said dual functional substances with one or more exclusively photosensitive substances or one or more exclusively cationically polymerizable substances, or
   (4) a mixture of (1) and (2).

3. A process according to claim 1, in which (A) is a 1,2-epoxide, a phenoplast, an aminoplast or a cyclic vinyl ether.

4. A process according to claim 3, in which (A) is a cycloaliphatic epoxide resin, a monoglycidyl ether, a polyglycidyl ether, or an advanced polyglycidyl ether, or a polyhydric alcohol or phenol, a cyclic vinyl ether containing a dihydropyran residue, or a phenol-formaldehyde resol.

5. A process according to claim 1, in which (B) is a salt, or a complex of a Lewis acid with an organic material, which liberates a polymerizing species on electrolysis.

6. A process according to claim 5, in which (B) is a salt of formula $$[A^{y+}]_a [Z^{x-}]_b \qquad I$$

where
A$^{y+}$ denotes a cation which is a metal, a metal complex, an organometallic, a heterocycle, ammonium, a sulfonium, an iodonium, a sulfoxonium, an iodosyl, a substituted ammonium, or a phosphonium ion,
Z$^{x-}$ denotes an anion of a protic acid, and
a, b, x, and y each denote 1, 2, or 3, such that (ay) is the same as (bx).

7. A process according to claim 6, in which the anion Z$^{x-}$ is derived from an organic carboxylic acid, an organic sulfonic acid Y—SO$_3$H, where Y denotes an aliphatic, aromatic or aliphatic-substituted aromatic group, or an inorganic acid.

8. A process according to claim 7, in which the anion Z$^{x-}$ is pentafluorohydroxoantimonate or an anion of formula $$MQ_d^-$$

where
M represents an atom of a metal or metalloid, selected from boron, phosphorus, antimony and arsenic,
Q represents a halogen atom, and
d is an integer of from 4 to 6 and is one more than the valency of M.

9. A process according to claim 5, in which (B) is a complex of boron trifluoride with an amine or with a phosphine substituted by three aliphatic or aromatic groups.

10. A process according to claim 1, in which (C) is a photocurable material in which cure is effected by direct activation of a photosensitive group through irradiation.

11. A process according to claim 10, in which the photosensitive group is an azido, coumarin, stilbene, maleimido, pyridinone, chalcone or anthracene group, or an acrylic ester group substituted in the 3-position by a group having ethylenic unsaturation or aromaticity in conjugation with an acrylic double bond.

12. A process according to claim 1, in which (C) is a photocurable material in which irradiation activates a suitable initiator molecule which then activates photopolymerizable groups.

13. A process according to claim 12, in which (C) is
   an epoxide resin, a phenolic resin, a urea-formaldehyde resin, a cyclic ether, cyclic ester, cyclic sulfide, cyclic amine or organosilicon cyclic in combination with a radiation-sensitive aromatic 'onium or iodosyl salt,
   a full or partial ester of acrylic or methacrylic acid with an aliphatic monohydric alcohol, a glycol or higher functional polyol, or with a compound containing one or more epoxide groups, or
   an ester formed by reaction of an epoxide with an adduct of a hydroxyalkyl acrylate or methacrylate with a saturated or unsaturated polycarboxylic acid anhydride.

14. A process according to claim 2, in which the liquid composition comprises, as a dual functional material, an epoxy group- or methylol group-containing acrylate, methacrylate, chalcone or cinnamate, or a vinyl group-containing chalcone.

15. A process according to claim 1, in which (C) is a photosolubilisable material.

16. A process according to claim 15, in which (C) is a quinone diazide, an o-nitrophenyl acetal or a polyester or end-capped derivative thereof, or a resin having a chain containing a benzoin group.

17. A process according to claim 1, in which the liquid composition also contains a hydrophilic polymer.

18. A process according to claim 1, in which step (ii) is effected by mixing (A), (B) and (C) in an aqueous, organic or aqueous organic solvent in an electrolytic bath, inserting the substrate as anode and a similar or different conductive material as cathode, and passing a current until a suitable thickness of polymerized material has been deposited on the anode.

19. A process according to claim 1, in which the voltage used in step (ii) is from 5 V to 100 V.

20. An image produced by a process according to claim 1.

* * * * *